United States Patent
Lee et al.

(10) Patent No.: US 7,524,706 B2
(45) Date of Patent: Apr. 28, 2009

(54) METHOD OF FABRICATING A THIN FILM TRANSISTOR ARRAY PANEL

(75) Inventors: Je Hun Lee, Seoul (KR); Yang Ho Bae, Suwon-si (KR); Beom Seok Cho, Seoul (KR); Chang Oh Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 68 days.

(21) Appl. No.: 11/844,597

(22) Filed: Aug. 24, 2007

(65) Prior Publication Data

US 2008/0038885 A1     Feb. 14, 2008

Related U.S. Application Data

(62) Division of application No. 11/234,470, filed on Sep. 23, 2005, now Pat. No. 7,276,732.

(30) Foreign Application Priority Data

Sep. 24, 2004 (KR) ...................... 10-2004-0076813

(51) Int. Cl.
*H01L 21/00* (2006.01)
(52) U.S. Cl. .................. 438/149; 438/151; 438/685
(58) Field of Classification Search .................. 438/66, 438/149, 151, 648, 656, 685
See application file for complete search history.

(56) References Cited

U.S. PATENT DOCUMENTS

| | | | | |
|---|---|---|---|---|
| 6,613,614 B2 * | 9/2003 | Yamazaki et al. | ............ | 438/151 |
| 6,809,021 B2 * | 10/2004 | Ohtani et al. | ............... | 438/622 |
| 7,045,444 B2 * | 5/2006 | Yamazaki et al. | ........... | 438/471 |
| 7,420,211 B2 * | 9/2008 | Ohtani et al. | .................. | 257/72 |
| 2004/0222421 A1 | 11/2004 | Lee et al. | | |
| 2004/0263706 A1 | 12/2004 | Cho et al. | | |

* cited by examiner

*Primary Examiner*—Kevin M Picardat
(74) *Attorney, Agent, or Firm*—Haynes and Boone LLP

(57) ABSTRACT

A thin film transistor array panel includes a source electrode and a drain electrode composed of a Mo alloy layer and a Cu layer, and an alloying element of the Mo alloy layer forms a nitride layer as a diffusion barrier against the Cu layer. The nitride layer can be formed between the Mo alloy layer and the Cu layer, between the Mo alloy layer and the semiconductor layer or in the Mo alloy layer. A method of fabricating a thin film transistor array panel includes forming a data line having a first conductive layer and a second conductive layer, the first conductive layer containing a Mo alloy and the second conductive layer containing Cu, and performing a nitrogen treatment so that an alloying element in the first conductive layer forms a nitride layer. The nitrogen treatment can be performed before forming the first conductive layer, after forming the first conductive layer, or during forming the first conductive layer.

10 Claims, 15 Drawing Sheets

//  METHOD OF FABRICATING A THIN FILM TRANSISTOR ARRAY PANEL

CROSS-REFERENCE TO RELATED APPLICATIONS

This application is a Divisional of U.S. patent application Ser. No. 11/234,470 filed on Sep. 23, 2005 now U.S. Pat. No. 7,276,732 which claims priority to and the benefit of Korean Patent Application No. 10-2004-0076813, filed on Sep. 24, 2004, the disclosures of which are incorporated herein by reference in their entireties.

BACKGROUND OF THE INVENTION (a) Field of the Invention

The present invention relates to a thin film array panel, and in particular, to a thin film transistor array panel for a display device.

(b) Description of the Related Art

A liquid crystal display (LCD) panel includes a number of pixels arranged in a matrix form and signal lines, which are composed of gate lines and data lines, arranged between the pixels. Typically, each pixel has a pixel electrode, which is to display an image, and a switching transistor. The switching transistor, in response to the magnitude of scanning signals from the gate lines, controls the flow of the data signals from the data line to the pixel electrode.

For the purpose of uniformly driving the LCD panel, uniform supply of the scanning and data signals to the pixels is provided across the panel. Thus, when the size and the resolution of the panel increases, the demand for low resistance signal lines increases. For this reason, Copper, which is a low resistance metal, has been heavily considered for the signal lines. However, the adhesion between the copper and the glass substrate of LCD panel is poor, and copper ions tend to penetrate into the silicon layer of LCD panel. These problems should be solved for a successful application of copper on the LCD panel.

SUMMARY OF THE INVENTION

In accordance with an embodiment of the present invention, a thin film transistor array panel includes: a gate line and a gate electrode formed on a substrate; a gate insulating layer formed on the gate line and the gate electrode; a semiconductor layer formed on the gate insulating layer; a data line including a source electrode formed on the gate insulating layer; and a drain electrode formed on the semiconductor layer. The source electrode and the drain electrode include a Mo alloy layer and a Cu layer, and an alloying element of the Mo alloy layer forms a nitride layer as a diffusion barrier against the Cu layer.

The alloying element of the Mo alloy layer is Ti, Ta, Zr or Nb, and the content of the alloying element is no more than 10 atm %. The content of nitrogen in the nitride layer is from 0.01 atm % to 50 atm %. The nitride layer can be formed between the Mo alloy layer and the Cu layer, between the Mo alloy layer and the semiconductor layer or in the Mo alloy layer.

In accordance with another embodiment of the present invention, a method of fabricating a thin film transistor array panel includes: forming a gate line on a substrate; forming a gate insulating layer on the gate line; forming a semiconductor layer on the gate insulating layer; forming a data line having a first conductive layer and a second conductive layer, the first conductive layer containing a Mo alloy and the second conductive layer containing Cu, and performing a nitrogen treatment so that an alloying element in the first conductive layer forms a nitride layer.

The nitrogen treatment can be performed before forming the first conductive layer, after forming the first conductive layer, or during forming the first conductive layer.

BRIEF DESCRIPTION OF THE DRAWINGS

Use of the same reference symbols in different figures indicates similar or identical items.

DETAILED DESCRIPTION OF EMBODIMENTS

The present invention now will be described fully hereinafter with reference to the accompanying drawings, in which specific embodiments of the invention are shown. The present invention may, however, be embodied in many different forms and should not be construed as limited to the embodiments set forth herein. The present invention is directed to the use of copper in the signal lines of a TFT array panel for a liquid crystal display (LCD) device. Since copper shows several problems, such as the poor adhesion to a glass substrate and the penetration into silicon layer. Thus, the present invention provides a solution for such problems.

Figure 1:
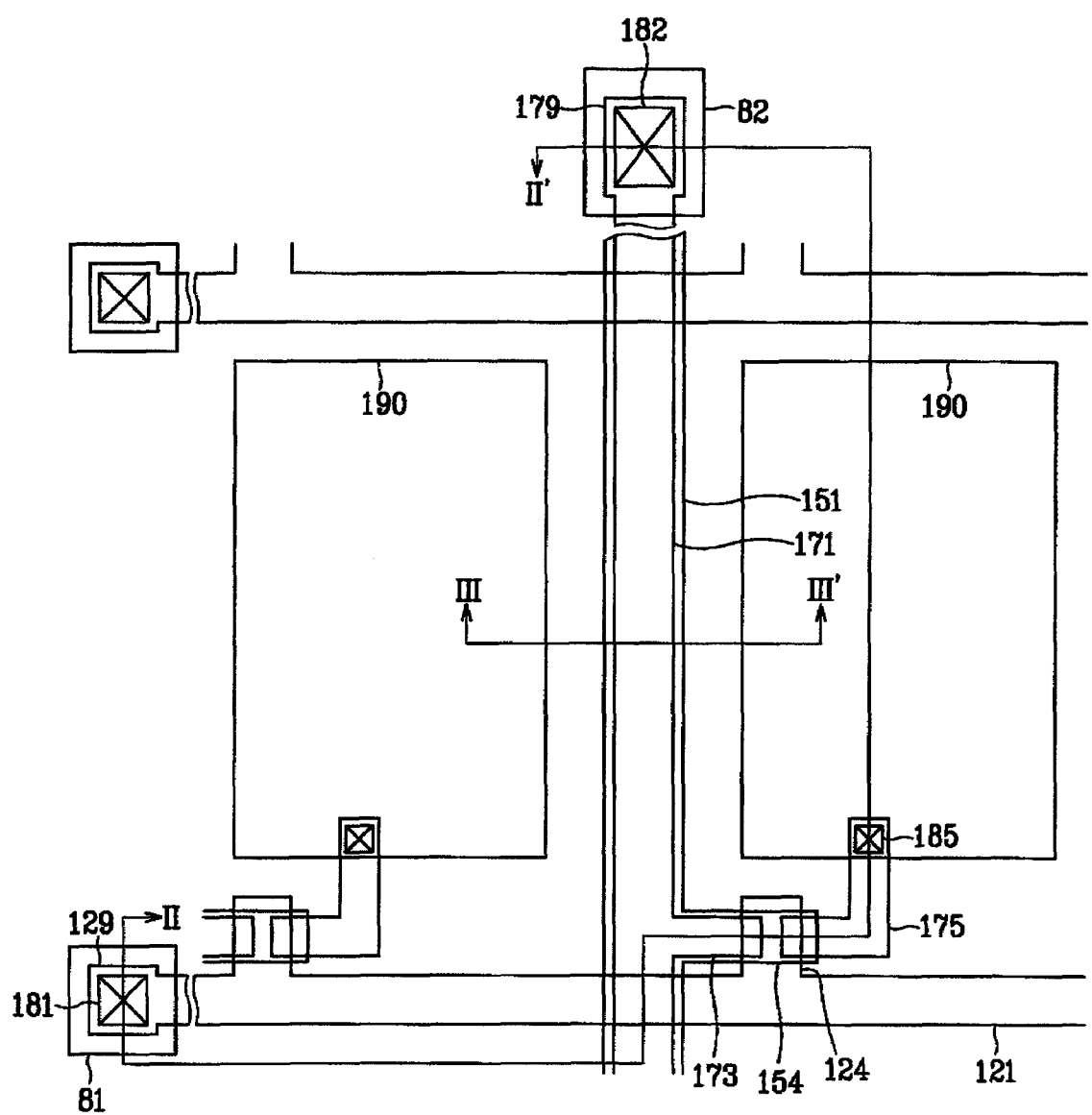
FIG. 1 is a schematic layout of a TFT (Thin Film Transistor) array panel according to an embodiment of the present invention.
Figure 2:
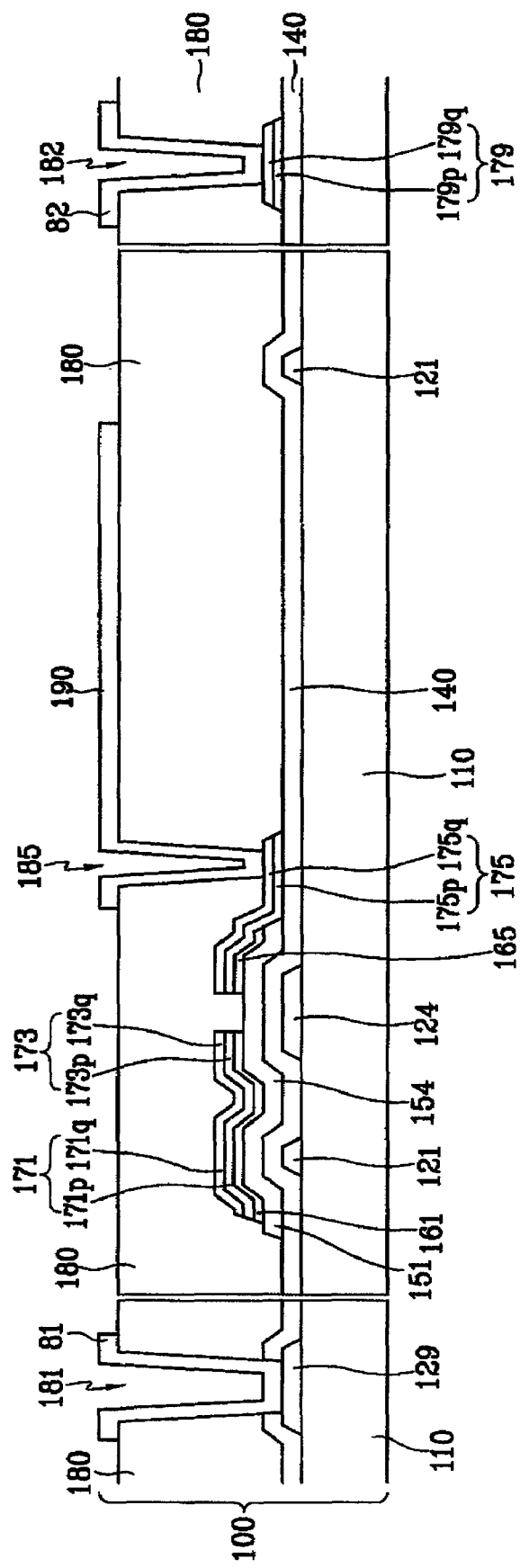
FIG. 2 is a cross-sectional view taken along the line II-II' of the TFT array panel of FIG. 1.
Figure 3:
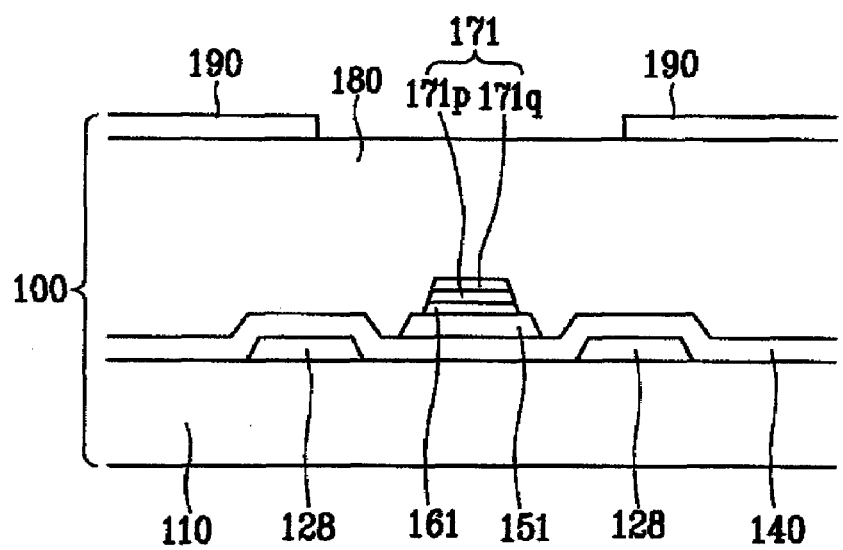
FIG. 3 is a cross-sectional view taken along the line III-III' of the TFT array panel of FIG. 1.

A TFT array panel 100 in accordance with an embodiment of the invention will be described in detail with reference to FIGS. 1-3. FIG. 1 shows the layout of TFT array panel 100. FIG. 2 is a cross-sectional view of TFT array panel 100 taken along the line II-II' of FIG. 1. FIG. 3 is a cross-sectional view of TFT array panel 100 taken along the line III-III' of FIG. 1.

A number of gate lines 121 that transmit gate signals are formed on an insulating substrate 110. Each gate line 121 extends in a transverse direction and includes a number of gate electrodes 124. Gate lines 121 may extend so as to connect to a driving circuit (not shown). The driving circuit can be integrated on substrate 110, or can be attached to substrate 110 as an integrated circuit chip.

Gate line 121 can have a two-layer structure including a lower layer and an upper layer. One of the upper and lower layers is made of a low resistance metal such as Al, Al alloy, Cu or Cu alloy in order to reduce signal delay or voltage drop in gate line 121. The other of the upper and lower layers is made of a metal that has good physical, chemical, and electrical contact characteristics with indium tin oxide (ITO) and indium zinc oxide (IZO). Such metals include Cr, Mo, Mo alloy, Ta and Ti. An exemplary structure of gate line 121 includes a lower Cr layer and an upper Al (or Al—Nd) layer. Gate electrode 124 can have the same two-layer structure as gate line 121. Gate line 121 may have a single layer structure, which is made of Al, Al alloy, Ag, Ag alloy, Cu, Cu alloy, Cr, Mo, Mo alloy, Ta, or Ti. Alternatively, gate line 121 may have a multi-layered structure having an intermediate Al or Al alloy layer. In addition, the sides of the gate lines 121 are inclined relative to the surface of substrate 110, and the inclination angle ranges about 30-80 degrees.

A gate-insulating layer 140 made of a silicon nitride (SiNx) is formed on gate lines 121 and gate electrodes 124.

A semiconductor layer 151, which is often made of hydrogenated amorphous silicon (abbreviated to "a-Si"), is formed on gate-insulating layer 140. Semiconductor layer 151 extends in the longitudinal direction and has a number of branches 154 over gate electrodes 124.

An ohmic contact layer 161 and an ohmic contact island 165, which are often made of silicide or n+ hydrogenated a-Si heavily doped with n type impurity, are formed on semiconductor layer 151 as shown in FIG. 2.

The I sides of semiconductor layer 151 and ohmic contact layer 161 and ohmic contact island 165 are inclined relative to the surface of substrate 110, and the inclination angle is in the range of about 30-80 degrees.

A data line 171, a source electrode 173, and a drain electrode 175 are formed on ohmic contact layer 161 and ohmic contact island 165 and gate-insulating layer 140.

Data line 171, which transmits data voltage, extends in the longitudinal direction above gate line 121. Data line 171 includes an end portion 179 for the contact with an external device, and end portion 179 may have an increased area for enhancing the contact. Gate electrode 124, source electrode 173, and drain electrode 175 forms a TFT having a channel formed in semiconductor layer branch 154.

Data line 171, source electrode 173 and drain electrode 175 can have a two-layer structure, which is composed of upper layers 171$q$, 173$q$ and 175$q$, respectively, and lower layers 171$p$, 173$p$ and 175$p$, respectively. Upper layers 171$q$, 173$q$ and 175$q$ are made of copper, and lower layers 171$p$, 173$p$ and 175$p$ are made of nitrided Mo alloy. An exemplary list of the Mo alloy includes Mo—Ti, Mo—Ta, Mo—Nb, and Mo—Zr. The concentration of the alloying element is about between 0.01 atm % and 10 atm %. Thus, each of lower layers 171$p$, 173$p$ and 175$p$ has a nitride layer such as a TiN, TaN, NbN or ZrN layer. The nitride layer can be formed inside lower layers 171$p$, 173$p$ and 175$p$, at the interface between upper layers 171$q$, 173$q$ and 175$q$ and lower layers 171$p$, 173$p$ and 175$p$, and/or at the interface between lower layers 171$p$, 173$p$ and 175$p$ and ohmic contact layer 161 and ohmic contact island 165. The nitride layer is provided to stop the penetration of copper ion into semiconductor layer 151 and 154. The sides of data lines 171 and drain electrodes 175 are inclined relative to the surface of substrate 110, and the inclination angle range about 30-80 degrees.

Figure 4:
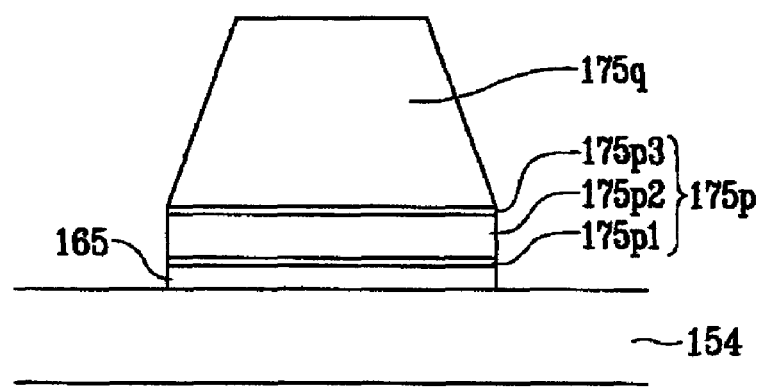
FIG. 4 is a cross-sectional view of a drain electrode in FIG. 2.

Referring to FIG. 4, nitride layers 175$p1$ and 175$p3$ are interposed both at the interface between upper layer 175$p$ and lower layer 175$q$ and at the interface between lower layer 175$q$ and ohmic contact island 165. The thickness of each of nitride layers 175$p1$ and 175$p3$ is more than 5 Å.

Referring to FIG. 2, a passivation layer 180 is formed on data line 171, drain electrodes 175, and exposed portions of semiconductor line 151, which are not covered with data line 171 and drain electrode 175. Passivation layer 180 has contact holes 182 and 185 exposing data line end portion 179 and drain electrode 175, respectively. A pixel electrode 190 and a contact assistant 82, which are made of ITO or IZO, are formed on passivation layer 180.

Pixel electrode 190 connects to drain electrode 175 through contact hole 185 such that pixel electrode 190 receives the data voltage from drain electrode 175 and transmit the received data voltage to a storage capacitor (not shown). Contact assistant 82 covers contact hole 182 so as to connect to data line end portion 179 through contact hole 182.

Figure 5:
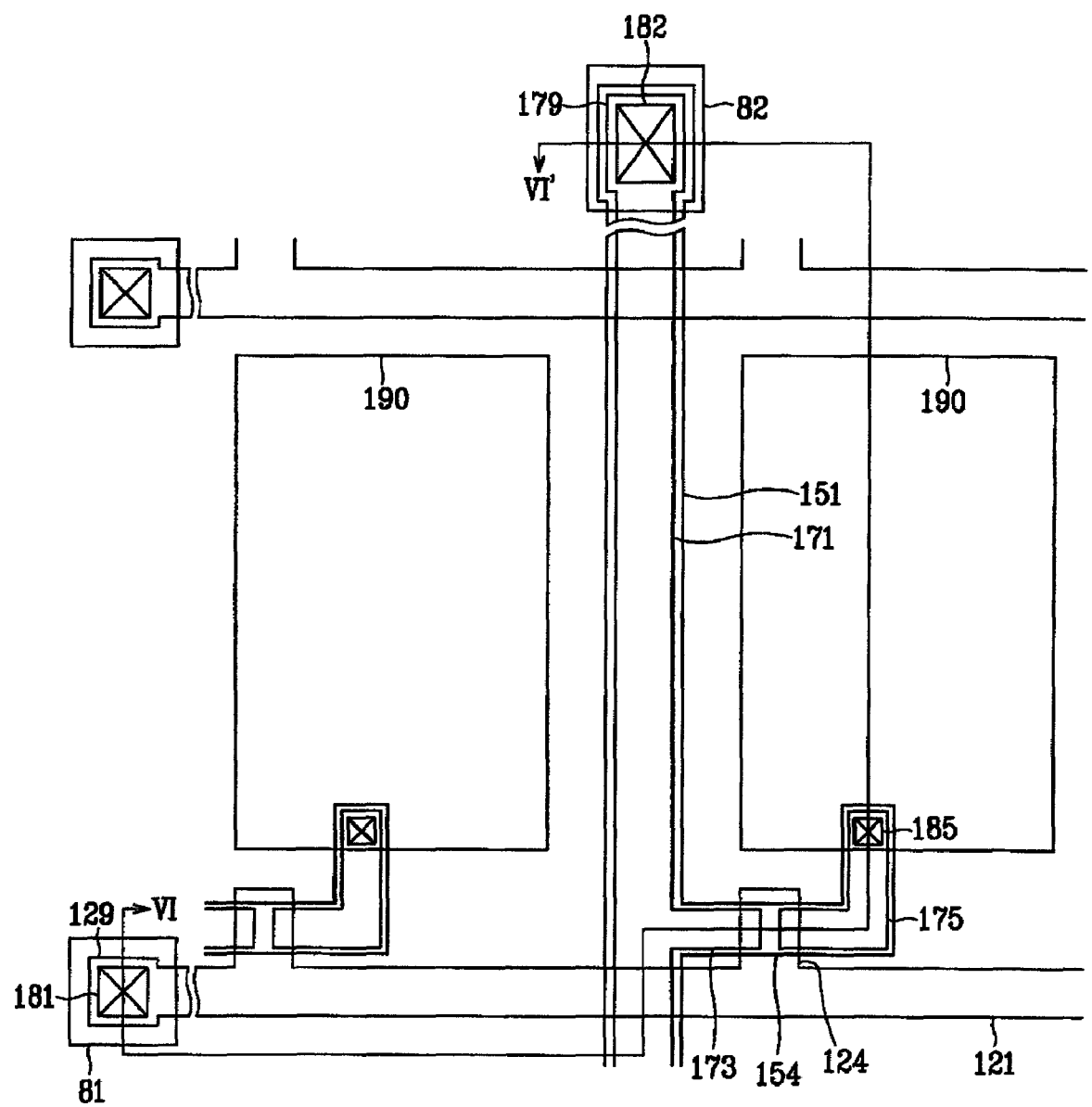
FIG. 5 is a schematic layout of a TFT array panel according to another embodiment of the present invention.
Figure 6:
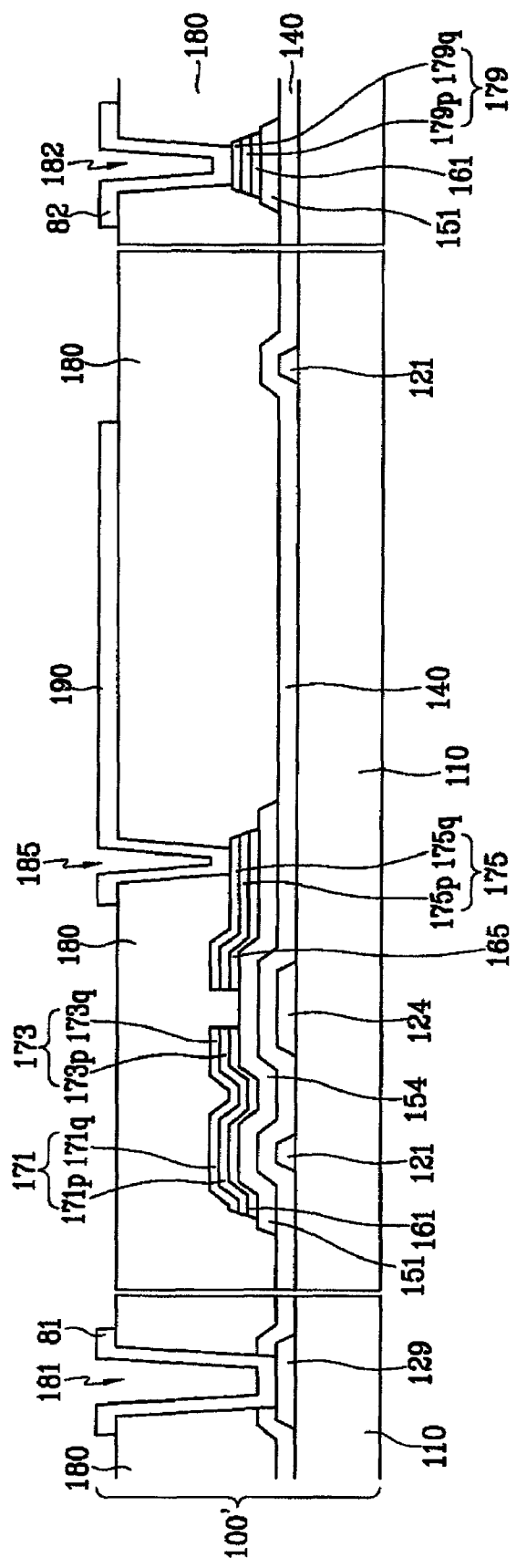
FIG. 6 is a cross-sectional view taken along the lines VI-VI' of a TFT array panel of FIG. 5.

A TFT array panel for an LCD according to another embodiment of the present invention will be described in detail with reference to FIGS. 5 and 6. FIG. 5 is a schematic layout of a TFT array panel 100' according to another embodiment of the present invention. FIG. 6 is a cross-sectional view taken along the lines VI-VI' of a TFT array panel of FIG. 5.

TFT array panel 100' is almost the same as TFT array panel 100 of FIG. 1.

The difference between TFT array panel 100 and TFT array panel 100' is the coverage of semiconductor layer branch 154, ohmic contact island 165, and drain electrode 175 as shown FIGS. 2 and 6. While, in TFT array panel 100, branch 154 of semiconductor layer 151 is completely covered with drain electrode 175, a portion of semiconductor layer branch 154 of TFT array panel 100' is not covered with drain electrode 175.

A method of manufacturing TFT array panel 100' is explained with reference to FIGS. 4 to 16.

Figure 7:
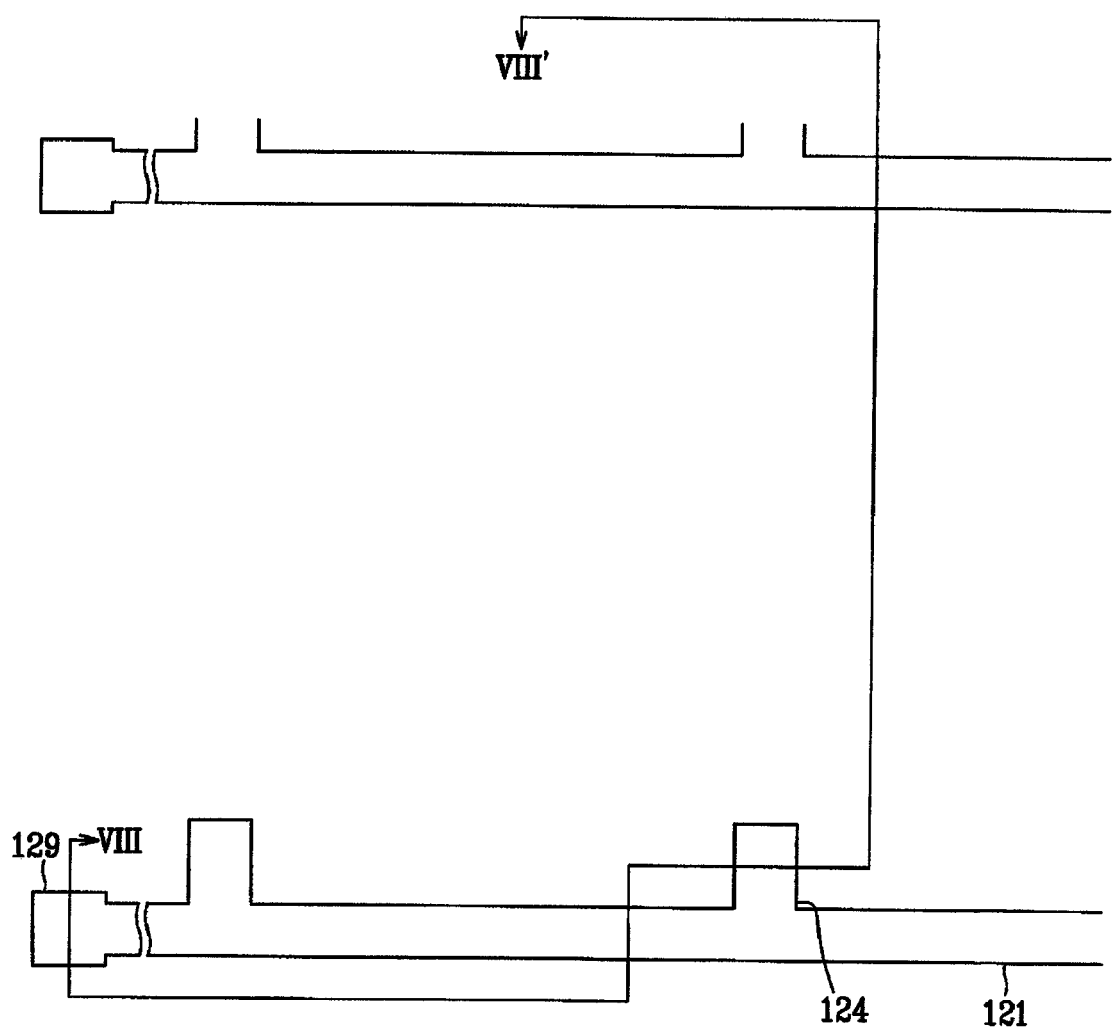
FIG. 7 shows the layout of the TFT array panel of FIG. 5 after the layer including a gate line and a gate electrode is formed on a substrate.
Figure 8:
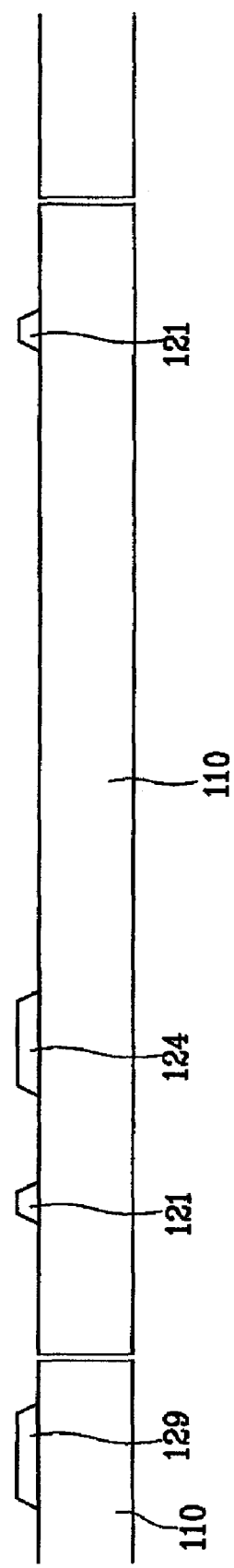
FIG. 8 is a cross-sectional view taken along the line XIII-XIIII' in FIG. 7.
Figure 9:
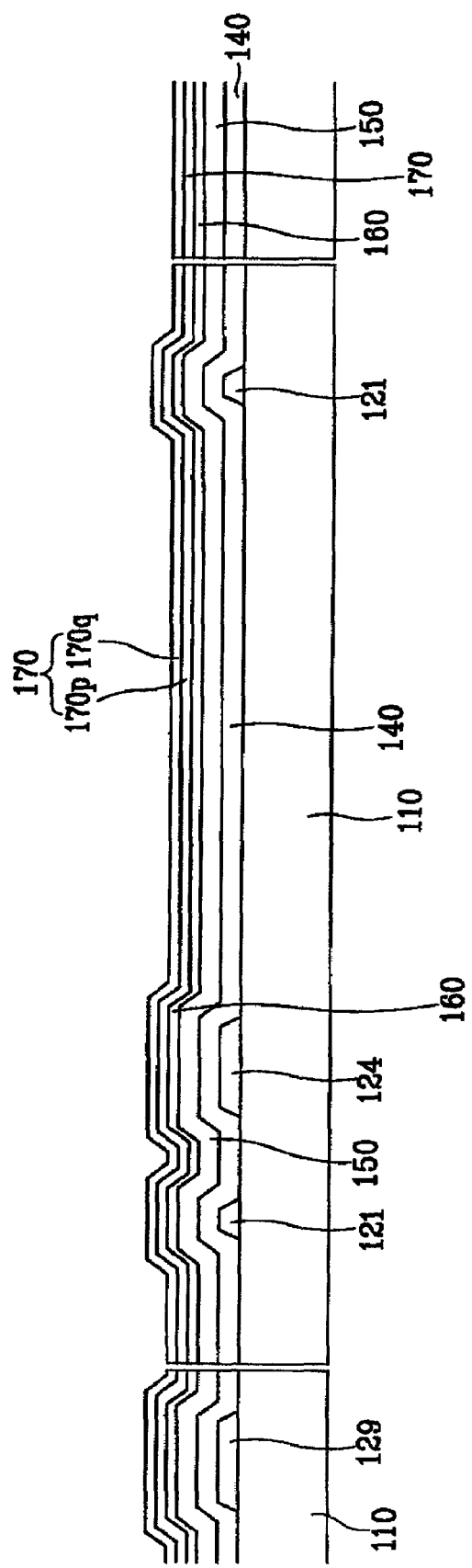
FIG. 9 shows the structure of FIG. 8 after a number of additional layers are formed thereon.
Figure 10:
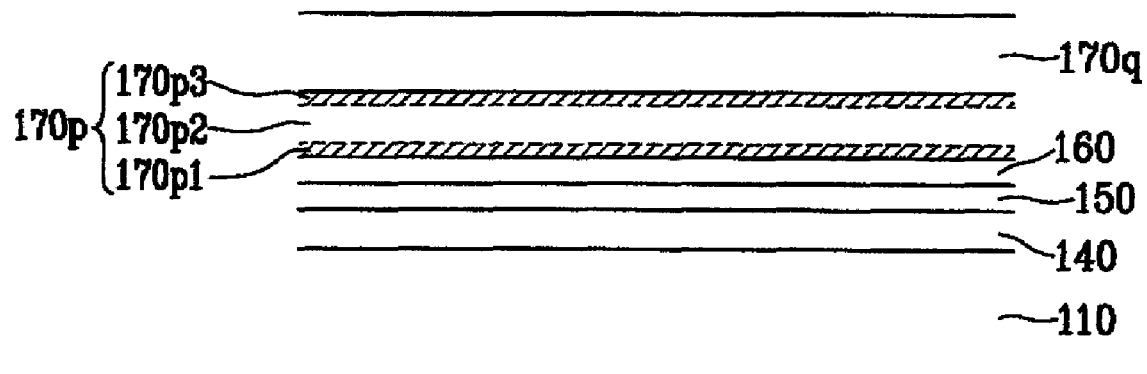
FIG. 10 is an expanded cross-sectional view that shows the order of deposited layers of FIG. 9.
Figure 11:
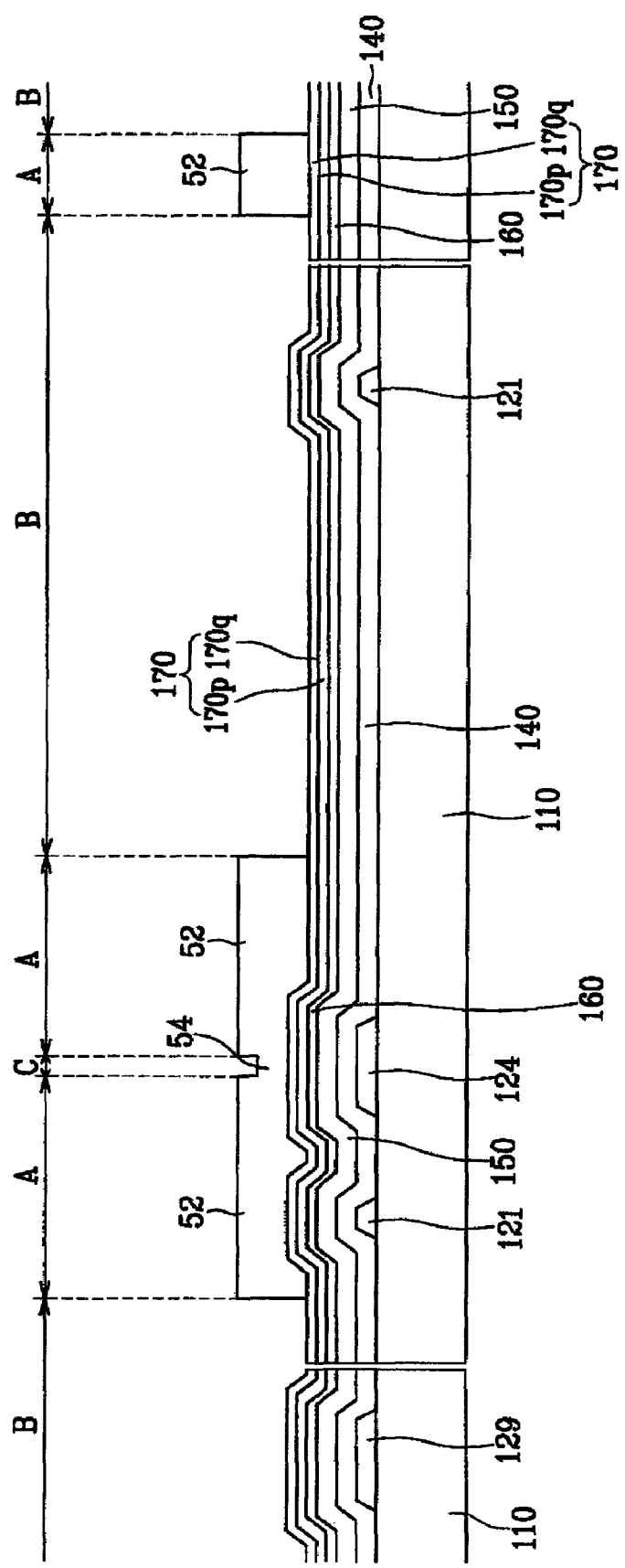
FIG. 11 shows the structure of FIG. 9 after a photo-resist pattern is formed thereon.
Figure 12:
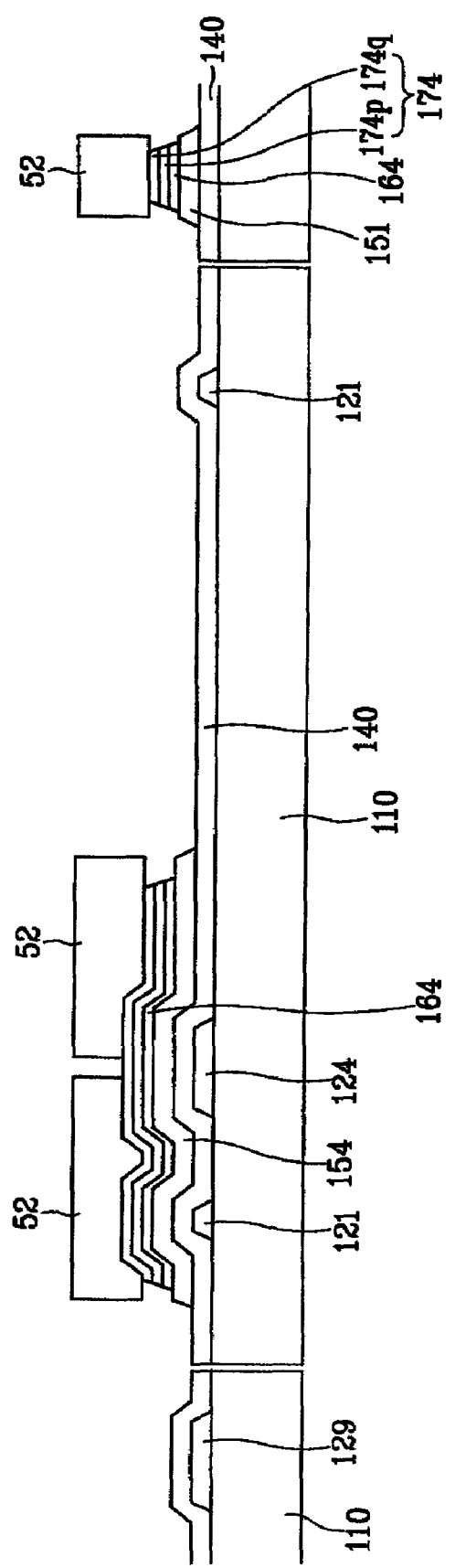
FIG. 12 shows the structure of FIG. 11 after portions of the deposited layers are removed.
Figure 13:
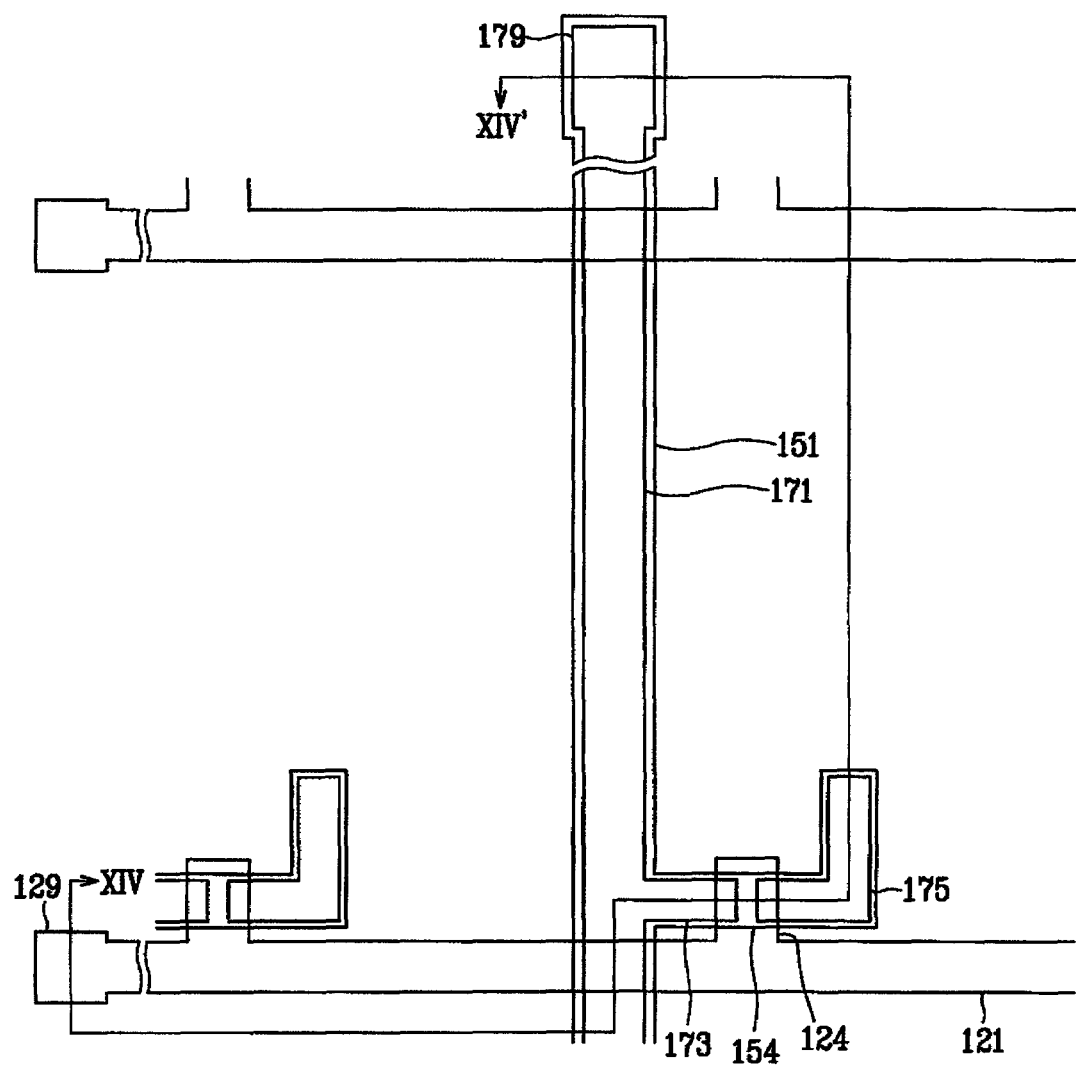
FIG. 13 shows the layout of the TFT array panel of FIG. 5 after a TFT is formed.
Figure 14:
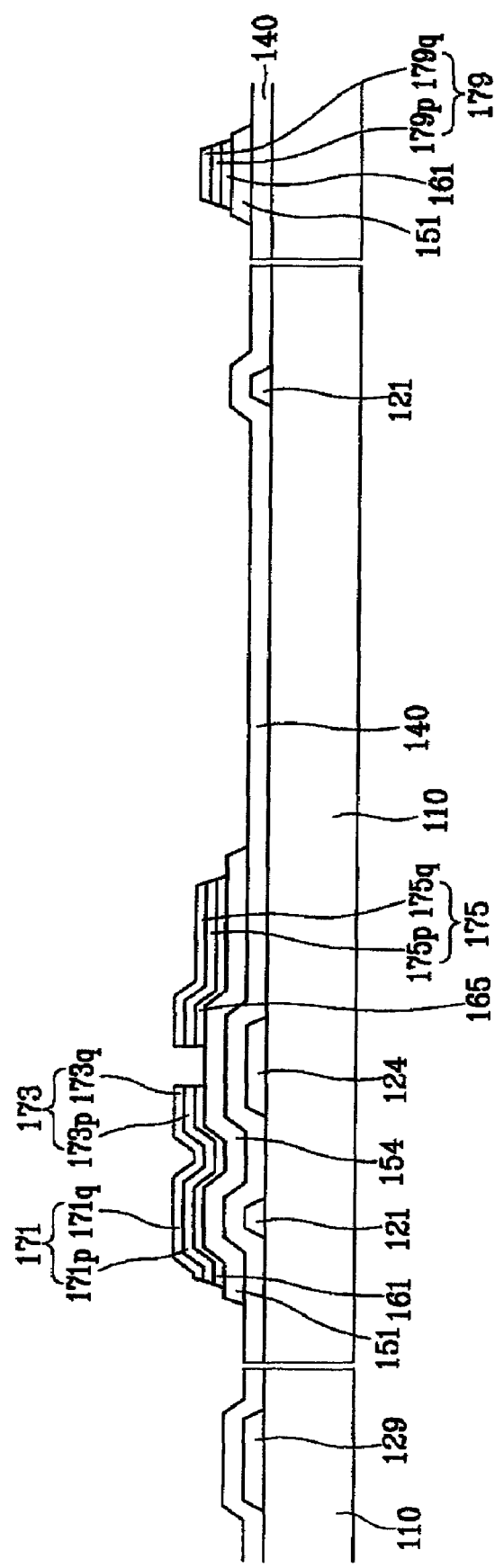
FIG. 14 is a cross-sectional view taken along the line XIV-XIV' of the TFT array panel of FIG. 13.
Figure 15:
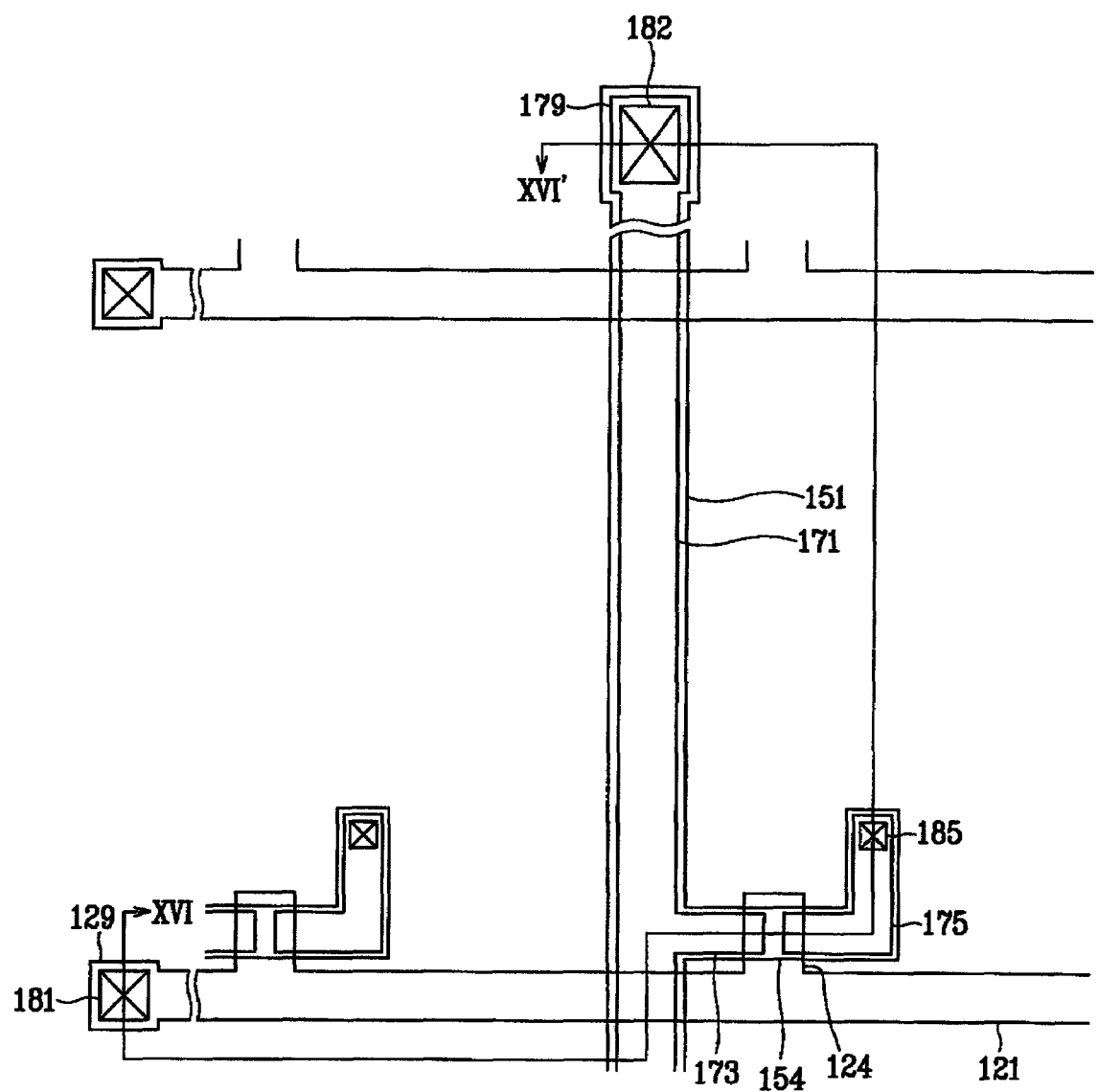
FIG. 15 shows the layout of the TFT array panel of FIG. 5 after a passivation layer is formed on the structure of FIG. 14.
Figure 16:
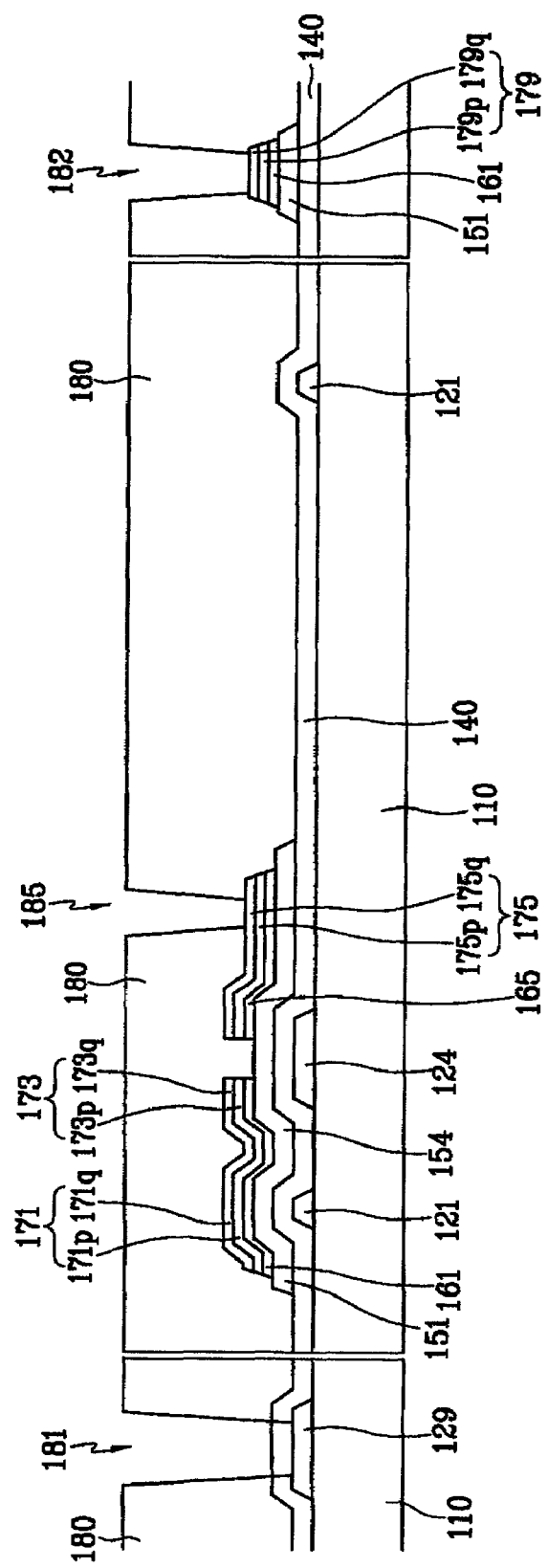
FIG. 16 is a cross-sectional view taken along the line XVI-XVI' of the TFT array panel of FIG. 15.

FIG. 7 shows the layout of TFT array panel 100' after gate line 121 and gate electrode 124 are formed on substrate 110. FIG. 8 is a cross-sectional view of the structure of FIG. 7 taken along the line XIII-XIIII'. FIG. 9 shows the structure of FIG. 8 after a number of additional layers are formed thereon. FIG. 10 is an expanded cross-sectional view that shows the order of deposited layers of FIG. 9. FIG. 11 shows the structure of FIG. 9 after a photo-resist pattern 52 is formed thereon. FIG. 12 shows the structure of FIG. 11 after portions of the deposited layers are removed. FIG. 13 shows the layout of TFT array panel 100' after a TFT is formed. FIG. 14 is a cross-sectional view taken along the line XIV-XIV' of the TFT array panel of FIG. 13. FIG. 15 shows the layout of TFT array panel 100' after a passivation layer is formed on the structure of FIG. 14. FIG. 16 is a cross-sectional view taken along the line XVI-XVI' of the TFT array panel of FIG. 15.

Referring to FIGS. 7 and 8, gate line 121 and gate electrode 124 are formed on substrate 110 by depositing and photo-etching a conductive layer.

Referring to FIG. 9, gate insulating layer 140, an a-Si layer 150, and an n+ type a-Si layer 160 are sequentially deposited by CVD such that layers 140, 150 and 160 have the thickness of 1,500-5,000 Å, 500-2,000 Å and 300-600 Å, respectively. A conductive layer 170 is deposited by sputtering on a-Si layer 160. Conductive layer 170 is composed of a lower layer 170$p$ and an upper layer 170$q$.

Mo alloy is used as a target for forming lower layer 170$p$ of conductor layer 170. The atmosphere in the sputtering chamber is a nitrogen atmosphere. Mo alloys for the sputtering include Mo—Ti, Mo—Ta, Mo—Nb and Mo—Zr. The nitrogen atmosphere is formed by using $N_2$ gas, $HN_3$ gas, $N_2O$ gas.

The content of the alloying element of Mo for diffusion barrier is so as not to deform the original structure of Mo. Thus, the maximum concentration of Ti for diffusion barrier is 12 atm %. The maximum concentration of Zr for diffusion barrier is 10 atm %. The maximum concentration of Ta or Nb for diffusion barrier is not limited.

In consideration of the etch rate of lower layer 170$p$, the higher content of the alloying element worsens the etch rate. The preferred concentration of the alloying element is between 0.01~10 atm %. The thickness of the nitride layer is more than 5 Å. The preferred concentration of the nitrogen for diffusion barrier is between 0.01~50 atm %.

In consideration of the etch rate of lower layer 170$p$, the more content of the alloying element worsens the etch rate. The preferred concentration of the alloying element is between 0.01~10 atm %. The thickness of the nitrified layer is more than 5 Å. The preferred concentration of the nitrogen for diffusion barrier is between 0.01~50 atm %.

As mentioned previously, the nitride layer is formed through a treatment under the nitrogen atmosphere. The nitrogen treatment can be applied during the whole sputtering process, only during the first period of sputtering, or only during the last period of sputtering. The nitride layer is formed on or beneath the Mo alloy layer when the nitrogen treatment is carried out in the first or last period of sputtering.

Alternatively, the nitrogen treatment can be performed before or after sputtering the Mo alloy.

In the case of the nitrogen treatment before sputtering the Mo alloy, the nitrogen is absorbed in n+ type a-Si layer 160, which becomes ohmic contact layer 161 and ohmic contact island 165 of FIG. 6 after patterning. When Mo alloy is sputtered, the nitrogen in n+ type a-Si layer 160 and the alloying element of Mo alloy combine and make a nitride layer as a diffusion barrier.

In the case of the nitrogen treatment before sputtering the Mo alloy, the nitrogen is absorbed in n+ type a-Si layer 160, which becomes ohmic contact layer 161 and ohmic contact island 165 of FIG. 6 after patterning. When Mo alloy is sputtered, the nitrogen in n+ type a-Si layer 160 and the alloying element of Mo alloy combine and make a nitrified layer as a diffusion barrier.

In the case of the nitrogen treatment after sputtering the Mo alloy, the alloying element of Mo alloy and the nitrogen from the nitrogen treatment combine and make a nitride layer as a diffusion barrier on the surface layer of lower layer 170.

Another method for forming the nitride layer is sputtering under non-Nitrogen atmosphere and exposing in the air so that the nitrogen in the air is absorbed to the surface layer of lower layer 170$p$.

After forming lower layer 170$p$, upper layer 170$q$ is formed by depositing copper on lower layer 170P.

Referring to FIG. 11, a photo-resist pattern 52 is formed on conductive layer 170. Photo-resist pattern 52 has a thinner portion 54. The thickness ratio of thinner portion 54 to other portions of photo-resist pattern 52 is determined according to the process conditions in the subsequent process steps. In general, the thickness of thinner portion 54 is equal to or less than half of the thickness of the other portions of photo-resist pattern 52.

Thinner portion 54, under which a semiconductor channel is to be formed, of photo-resist 52 enables by etching to fabricate data line 171, source electrode 173, drain electrode 175, ohmic contact layer 161, ohmic contact island 165 and semiconductor layer 151.

An exemplary sequence of forming data line 171, source electrode 173, drain electrode 175, ohmic contact layer 161, ohmic contact island 165 and semiconductor layer 151 is as follows. For descriptive purposes, as shown in FIG. 11, the structure of FIG. 11 is divided into three areas. Area A is where photo-resist 52 is, area B is where no photo-resist 52 is, and area C is where thinner portion 54 of photo-resist 52 is.

Referring to FIGS. 11 and 12, the portions of conductive layer 170, a-Si layer 160 and a-Si layer 150 corresponding to area B is removed. Then, the portion of photo-resist 52 corresponding to area C is removed, and the portions of conductive layer 170, a-Si layer 160 and a-Si layer 150 corresponding to area C is removed. Finally, remaining photo-resist 52 corresponding to area A is removed.

Another exemplary sequence is as follows. The portion of conductive layer 170 corresponding to area B is removed, and the portion of photo-resist 52 corresponding to area C is removed. Then, the portions of the a-Si layer 160 and a-Si layer 150 corresponding to area B are removed. Next, the portion of conductive layer 170 corresponding to area C is removed, and the portion of photo-resist 52 corresponding to area A is removed. Finally, the portion of a-Si layer 160 corresponding to area C is removed.

Referring to FIGS. 11 to 14, the first exemplary sequence is explained in more details. The portion of conductive layer 170 on corresponding to area B is removed by wet etching or dry etching so that the portion of extrinsic a-Si layer 160 corresponding to area B is exposed. An Al or Al alloy layer is preferably wet-etched, and a Mo or Mo alloy layer can be etched by dry-etch or wet-etch.

Then, dry-etching removes the portions of a-Si layer 160 and a-Si layer 150 corresponding to area B, and removes the portion of photo-resist 52 corresponding to area C. The removal of the portion of photo-resist 52 is performed either simultaneously with or independent from the removal of the portions of a-Si layer 160 and a-Si layer 150. Residue of photo-resist 52 remaining on areas C is removed by ashing.

Referring to FIGS. 12 and 14, the portions of conductor layer 170 and a-Si layer 160 corresponding to area C are removed, and then, the portion of photo-resist 52 corresponding to area A is removed. The top surface of semiconductor layer branch 154 corresponding to area C may be partially removed to reduce the thickness of the semiconductor channel area.

Next, as shown in FIG. 16, passivation layer 180 is deposited and photo-etched along with gate insulating layer 140 so as to form contact holes 181, 182 and 185.

When passivation layer 180 is formed at an elevated temperature, the nitride layer can be formed at Mo alloy layer 170$p$ (FIG. 9). The quality of the nitride layer as a diffusion barrier depends on the alloying element of Mo alloy.

Finally, as shown in FIG. 6, pixel electrodes 190 and contact assistants 81 and 82 are formed on passivation layer 180 by sputtering and photo-etching an ITO or IZO layer.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of fabricating a thin film transistor array panel comprising:

forming a gate line on a substrate;
forming a gate insulating layer on the gate line;
forming a semiconductor layer on the gate insulating layer;

forming a data line having a first conductive layer and a second conductive layer, the first conductive layer containing a Mo alloy and the second conductive layer containing Cu, and performing a nitrogen treatment so that an alloying element in the first conductive layer forms a nitride layer.

2. The method of claim 1, wherein the alloying element of the first conductive layer is Ti, Ta, Zr or Nb.

3. The method of claim 2, wherein the content of the alloying element is more than 10 atm %.

4. The method of claim 1, wherein the content of nitrogen in the nitride layer is from 0.01 atm % to 50 atm %.

5. The method of thin film array panel of claim 1, further comprising forming a second insulating layer on the data line.

6. The method of claim 1, wherein the nitrogen treatment is performed before forming the first conductive layer.

7. The method of claim 1, wherein the nitrogen treatment is performed after forming the first conductive layer.

8. The method of claim 1, wherein the nitrogen treatment is performed during forming the first conductive layer.

9. The method of claim 1, wherein the thickness of the nitride layer is more than 5 A.

10. The method of claim 1, further comprising forming a second insulating layer on the data line and a forming a pixel electrode on the second insulating layer.

* * * * *